United States Patent
Petersson et al.

(10) Patent No.: US 8,483,798 B2
(45) Date of Patent: Jul. 9, 2013

(54) SYSTEM AND METHOD FOR METABOLIC MR IMAGING OF A HYPERPOLARIZED AGENT

(75) Inventors: J. Stefan Petersson, Helsingborg (SE); Sven Mansson, Bjarred (SE); Klaus Scheffler, Basel (CH)

(73) Assignee: General Electric Company, Schenectady, NY (US)

( * ) Notice: Subject to any disclaimer, the term of this patent is extended or adjusted under 35 U.S.C. 154(b) by 927 days.

(21) Appl. No.: 11/623,277

(22) Filed: Jan. 15, 2007

(65) Prior Publication Data
US 2008/0169809 A1      Jul. 17, 2008

(51) Int. Cl.
*A61B 5/05*      (2006.01)

(52) U.S. Cl.
USPC ........... 600/420; 600/407; 600/409; 600/410; 324/307; 324/309; 324/306; 324/312; 324/320; 128/899; 382/128

(58) Field of Classification Search
USPC .................. 600/407–480; 324/307, 309, 306, 324/312; 128/899; 382/128
See application file for complete search history.

(56) References Cited

U.S. PATENT DOCUMENTS

| | | | | |
|---|---|---|---|---|
| 5,196,795 A | * | 3/1993 | Bodenhausen et al. | 324/309 |
| 6,956,374 B2 | * | 10/2005 | Busse | 324/314 |
| 7,202,665 B1 | * | 4/2007 | Reeder | 324/307 |
| 7,227,356 B1 | * | 6/2007 | Hariharan et al. | 324/307 |
| 2002/0066287 A1 | * | 6/2002 | Driehuys | 62/637 |
| 2005/0001617 A1 | * | 1/2005 | Busse | 324/307 |
| 2005/0070785 A1 | * | 3/2005 | Ahluwalia et al. | 600/410 |
| 2006/0061358 A1 | * | 3/2006 | Hargreaves et al. | 324/307 |
| 2006/0241384 A1 | * | 10/2006 | Fisher et al. | 600/414 |
| 2007/0052416 A1 | * | 3/2007 | Bottcher et al. | 324/307 |
| 2008/0081375 A1 | * | 4/2008 | Tesiram et al. | 436/57 |

FOREIGN PATENT DOCUMENTS

| | | |
|---|---|---|
| JP | 2003-503710 A | 1/2003 |
| JP | 2005-502404 A | 1/2005 |
| JP | 2005-095631 A | 4/2005 |
| WO | 2005-106519 A1 | 11/2005 |
| WO | WO 2005/106519 | * 11/2005 |

OTHER PUBLICATIONS

Functional Brain Imaging Using a Blood Oxygenation Sensitive Steady State. Miller et al., Magnetic Resonance in Medicine 50:675-683 (2003).

Functional Brain Imaging with BOSS FMRI Miller, K.L.; Hargreaves, B.A.; Jongho Lee; Ress, D.; deCharms, R.C.; Pauly, J.M., Engineering in Medicine and Biology Society, 2004. IEMBS apos;04. 26th Annual International Conference of the IEEE vol. 2, Issue , Sep. 1-5, 2004 pp. 5234-5237 vol. 7.

K.W. Eberhardt et al., "Darkband SSFP," Proc. Intl. Soc. Mag. Reson. Med. 13 (2005), p. 2510.

(Continued)

*Primary Examiner* — Unsu Jung
*Assistant Examiner* — Nasir S Shahrestani
(74) *Attorney, Agent, or Firm* — Ziolkowski Patent Solutions Group, SC; Jean K. Testa

(57) ABSTRACT

A system and method for metabolic MR imaging of a hyperpolarized agent includes exciting a single metabolic species of a hyperpolarized agent injected into a subject of interest. MR signals are acquired from the excited single metabolic species and an image is reconstructed from the acquired MR signals.

21 Claims, 9 Drawing Sheets

OTHER PUBLICATIONS

Mansson et al., "13C imaging—a new diagnostic platform," European Radiology, Springer, Berlin, DE, vol. 16, 2006, pp. 57-67.

Bhattacharya et al., "Ultra-fast three dimensional imaging of hyperpolarized 13C in vivo," Magma, vol. 18, Nov. 2005, pp. 245-256.

Leupold et al., "Fast chemical shift mapping with multiecho balanced SSFP," MAGMA, vol. 19, Nov. 2006, pp. 267-273.

Svensson et al., "Hyperpolarized 13C MR Angiography Using TrueFISP," Magnetic Resonance in Medicine, vol. 50, 2003, pp. 256-262.

Bokacheva et al., "Single Breath-Hold T1 Measurement Using Low Flip Angle TrueFISP," Magnetic Resonance in Medicine, vol. 55, 2006, pp. 1186-1190.

* cited by examiner

SYSTEM AND METHOD FOR METABOLIC MR IMAGING OF A HYPERPOLARIZED AGENT

BACKGROUND OF THE INVENTION

The present invention relates generally to MR imaging and, more particularly, to metabolic MR imaging of a hyperpolarized agent.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which frequency is near the Larmor frequency, the net aligned moment, or "longitudinal magnetization", $M_z$, may be rotated, or "tipped", into the x-y plane to produce a net transverse magnetic moment $M_t$. A signal is generated by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques. It is desirable that the imaging process, from data acquisition to reconstruction, be performed as quickly as possible for improved patient comfort and throughput.

For some procedures and investigations, it is also desirable for MR images to display spectral information in addition to spatial information. One known method for acquiring MR signals and reconstructing MR images containing both spatial and spectral information is "chemical shift imaging" (CSI). CSI has been employed to monitor metabolic and other internal processes of patients, including imaging hyperpolarized substances such as $^{13}C$ labeled contrast agents and metabolites thereof. However, after injection of the hyperpolarized agent, imaging is a challenging task. The hyperpolarization of the agent has a limited lifetime, and imaging must be done rapidly. For example, typical T1 lifetimes of hyperpolarized agents are on the order of a few minutes in vivo. Furthermore, the RF excitations of the pulse sequence may destroy the hyperpolarization irreversibly.

The CSI method has some drawbacks which limit available signal-to-noise ratio, and thus image quality. For example, CSI tends to acquire data slowly, considering the short lifetimes of the increased magnetization of hyperpolarized substances. In addition, CSI typically exposes the imaging subject to a large number of RF excitations. These properties are especially unfavorable for a hyperpolarized agent because the hyperpolarized agent magnetization has a limited lifetime and is destroyed by the RF excitations of the CSI sequence. As a consequence, the available magnetization cannot be fully utilized by the CSI method, and the signal-to-noise ratio (SNR) is thus reduced.

Additionally, MR procedures which require very fast, or periodic data acquisition, such as cardiac imaging or metabolic imaging of the heart, are difficult to perform with CSI sequences because CSI can take more than 15 seconds for a 16×16 matrix, whereas cardiac and related metabolic imaging should be completed within a few heartbeats or a few seconds.

It would therefore be desirable to have a system and method capable of exciting and imaging a metabolic species of a hyperpolarized agent without affecting magnetization of metabolic species at other frequencies.

BRIEF DESCRIPTION OF THE INVENTION

Embodiments of the present invention provides a system and method of MR that overcome the aforementioned drawbacks. A single metabolic species of a hyperpolarized agent injected into a subject of interest is excited, and MR signals from the excited single metabolic species are acquired. An image is reconstructed from the acquired MR signals.

Therefore, in accordance with one aspect of the present invention, an MRI apparatus includes an MRI assembly having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a system controller coupled to the MRI assembly, the system controller configured to cause the RF coil assembly to excite a single metabolic species of a hyperpolarized agent injected into a subject of interest. The system controller further causes the RF transceiver system to acquire MR signals from the excited single metabolic species and reconstruct an image from the acquired MR signals.

In accordance with another aspect of the invention, a method of hyperpolarized agent MR imaging includes injecting a hyperpolarized agent into a subject of interest and exciting a first metabolic species of the hyperpolarized agent. The method also includes acquiring MR signals from the excited first metabolic species and reconstructing an image from the acquired MR signals.

According to a further embodiment of the invention, a computer readable storage medium includes a computer program stored thereon comprising instructions which when executed by a computer, causes the computer to modulate a plurality of flip angle train RF pulses of a pulse sequence. The instructions further cause the computer to acquire MR data from the plurality of molecules and generate an image from the MR data.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE INVENTION

Figure 1:
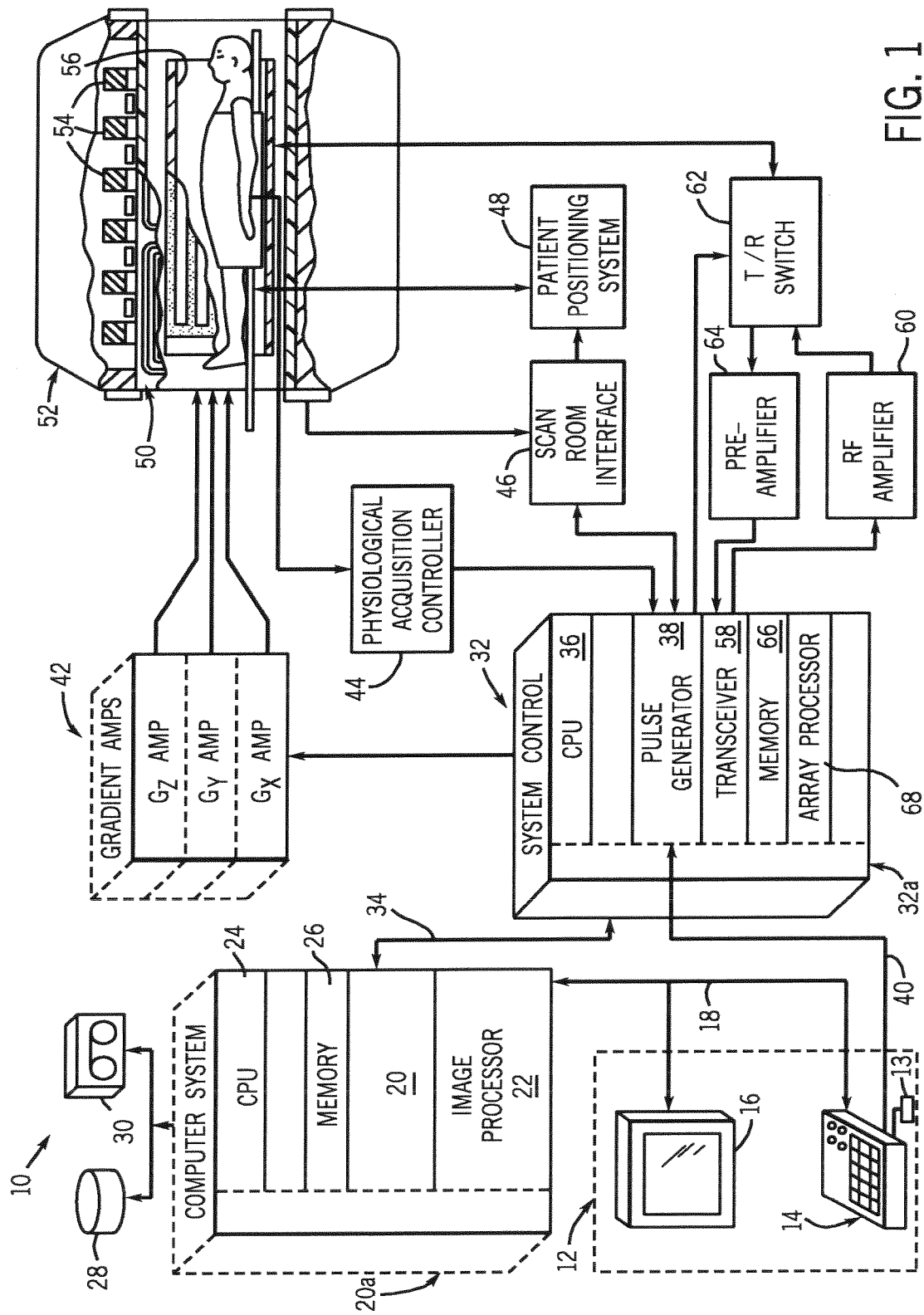
FIG. 1 is a schematic block diagram of an MR imaging system for use with embodiments of the present invention.

Referring to FIG. 1, the major components of a preferred magnetic resonance imaging (MRI) system 10 that may incorporate embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and removable storage 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the removable storage 30, or it may be further processed by the image processor 22 and conveyed to the operator console 12 and presented on the display 16.

A true fast imaging with steady presession (trueFISP) pulse sequence having low flip angles is described herein. As used herein, low flip angles are flip angles less than 15°. As described below, using low flip angles in conjunction with a trueFISP pulse sequence allows excitation and MR data acquisition of a single metabolite of a hyperpolarized agent, such as $^{13}C$, while minimizing adverse effects on the magnetization of other metabolites. As such, the full magnetization of the hyperpolarized agent can be used for image generation. That is, in steady-state proton imaging, the relatively short relaxation times of protons make the signal to be approximately 25% of $M_0$. In contrast, the much longer relaxation times of $^{13}C$ makes it possible to reach a transient response with a maximum signal close to 100% of $M_0$ as shown below.

Figure 2:
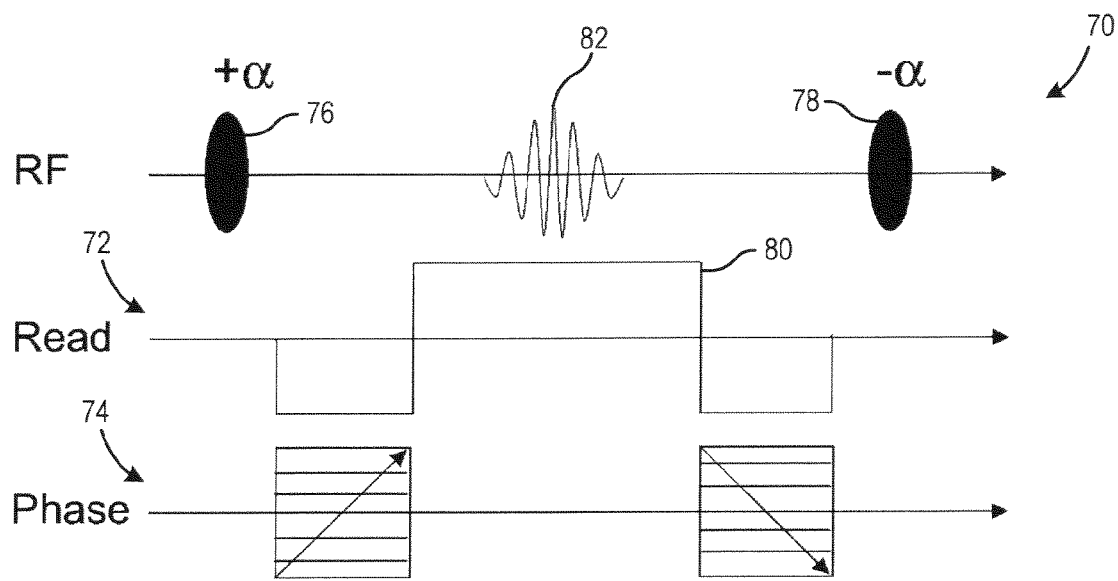
FIG. 2 is a pulse sequence diagram of a trueFISP sequence with the slice gradient omitted.

FIG. 2 shows a pulse sequence diagram of a trueFISP sequence 70 according to one embodiment of the present invention. The trueFISP sequence 70 is a fully balanced steady-state free precession (SSFP) sequence. TrueFISP sequence 70 includes balanced gradients 72 in the read or frequency direction and balanced gradients 74 in the phase direction applied between RF pulses 76, 78. During read gradient 80, a signal 82 is acquired, filling one k-space line.

Figure 3:
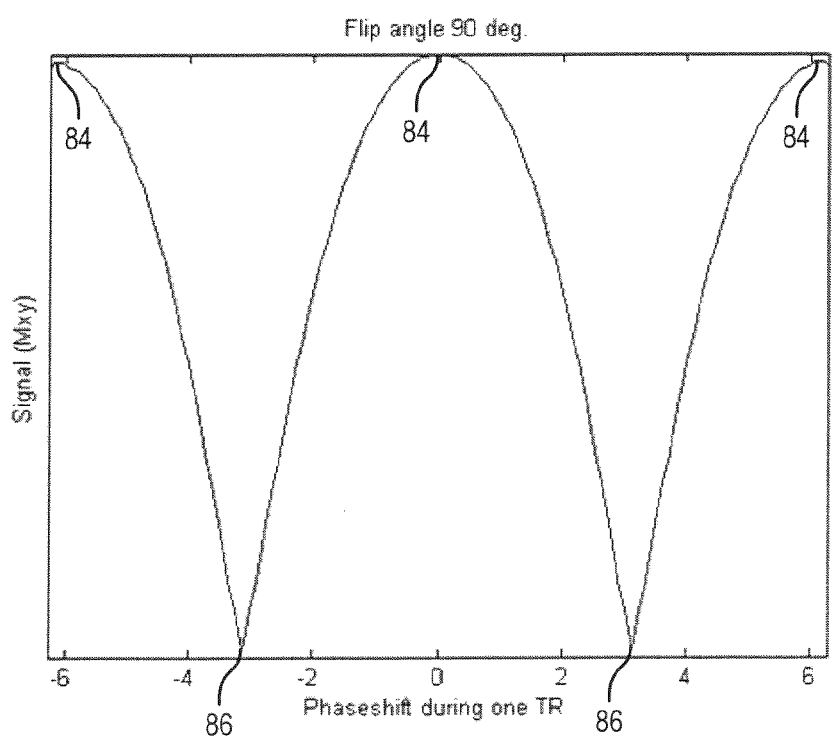
FIG. 3 is a graph of the signal of the trueFISP sequence of FIG. 2 as a function of phase accumulation between two successive RF pulses with a constant flip angle of 90°.

The trueFISP pulse sequence 70 is characterized by the signal 82 being dependent on a phase accumulation of the spins during the TR interval, i.e., the time between successive RF excitations. For spins perfectly on resonance, this phase accumulation is zero, but will be non-zero for off-resonance spins. As shown in FIG. 3, for a trueFISP pulse sequence with 90° flip angles of thermal equilibrium spins at steady-state, maximum signals 84 are obtained when the phase accumulation is $\pm 2n\cdot\pi$ (n=0, 1, 2 . . . ), and minimum signals 86 are obtained when the phase accumulation is $\pi \pm 2n\cdot\pi$ (n=0, 1, 2 . . . ). In reconstructed trueFISP images, the signal minima are visible as dark stripes. The off-resonance may be caused by inhomogeneities of the B0 field, or chemical shift.

Figure 4:
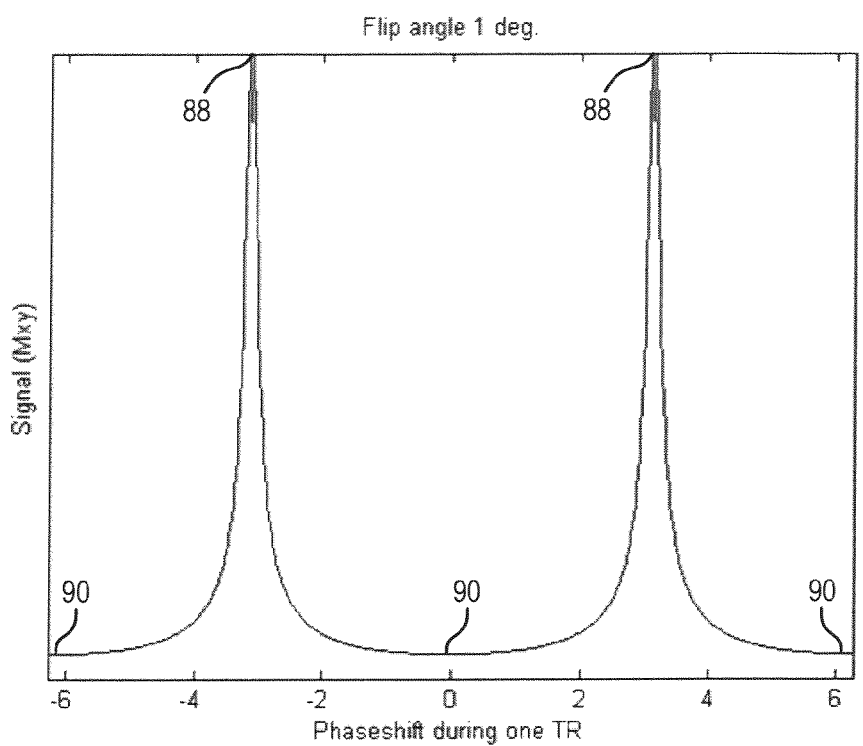
FIG. 4 is a graph of the signal of the trueFISP sequence of FIG. 2 as a function of phase accumulation between two successive RF pulses with a constant flip angle of 1°.

However, as shown in FIG. 4, if the flip angles of the trueFISP sequence 70 (shown in FIG. 2) are set to a low flip angle, e.g., 1°, an opposite result to that of FIG. 3 is obtained. Setting the flip angle to 1° results in obtaining maximum signals 88 when the phase accumulation is $\pi \pm 2n\cdot\pi$ (n=0, 1, 2 . . . ), and obtaining minimum signals 90 when the phase accumulation is $\pm 2n\cdot\pi$ (n=0, 1, 2 . . . ). Accordingly, signals 88 are obtained from a range of phase shifts at the same positions where signal minima were found for the signals shown in FIG. 3.

Figure 5:
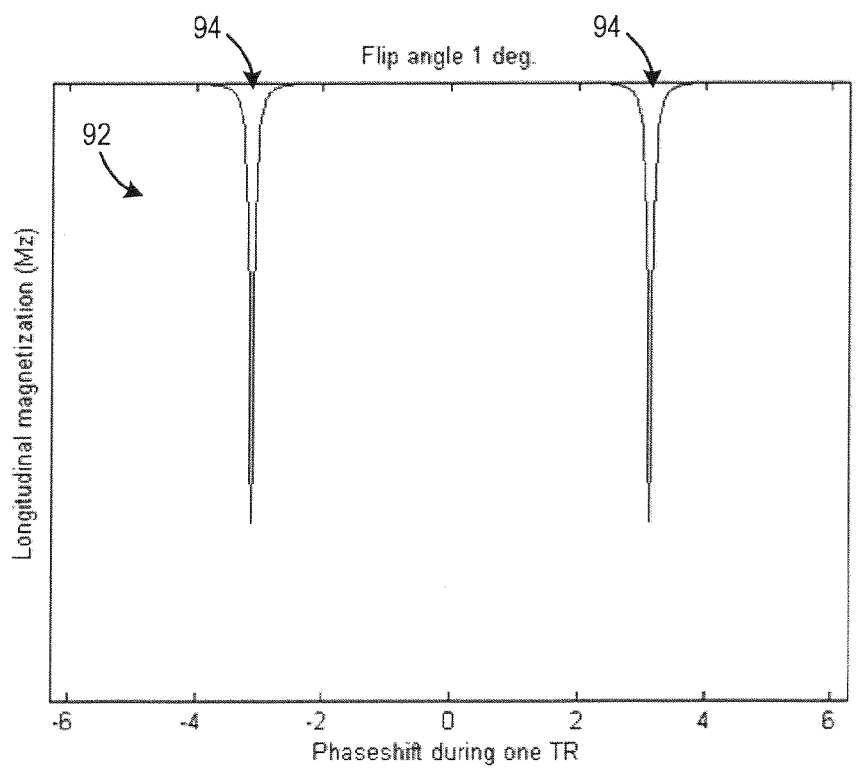
FIG. 5 is a graph of the longitudinal magnetization of the trueFISP sequence of FIG. 2 as a function of phase accumulation between two successive RF pulses with a constant flip angle of 1°.

FIG. 5 shows the longitudinal magnetization 92 (Mz) for the trueFISP sequence 70 (shown in FIG. 2) set to a low flip angle of 1°. The longitudinal magnetization 92 is minimally affected outside excitation bands 94. Consequently, magnetization from other metabolites will be preserved in an application with hyperpolarized substances. The position of the excitation bands 94 can be moved from phase=$\pm\pi$ to an arbitrary position by changing the phase cycling of the RF pulse. The width of the excitation profile is approximately 0.15° phase accumulation for a 1° flip angle. If TR=2 ms, a phase accumulation of 0.15° translates to a spectral width of approximately 12 Hz, or 0.75 ppm, for $^{13}$C at 1.5 T. The width of the excitation profile may also be modified by changing the flip angle.

Figure 6:
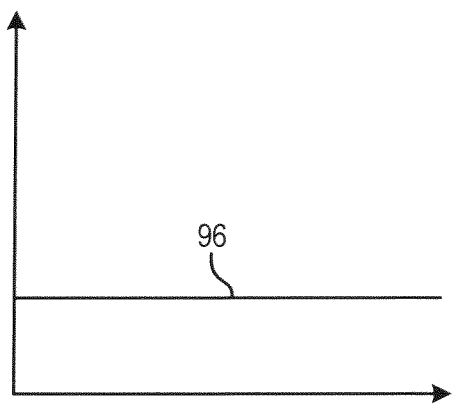
FIG. 6 is a modulation envelope of an RF pulse amplitude in accordance with an embodiment of the present invention.

FIG. 6 shows an RF pulse amplitude modulation envelope 96 according to one embodiment of the present invention. RF pulse amplitude modulation envelope 96 is a constant modulation envelope to which flip angles of the trueFISP sequence 70 (shown in FIG. 2) are set to acquire the signals of FIG. 4. As discussed above with regard to FIG. 4 and as shown in FIG. 6, the flip angles of the trueFISP sequence 70 (shown in FIG. 2) may be set to a constant, low flip angle, such as 1°, with total flip angle ranging from 90° to 180°. However, it is contemplated that the low flip angle may be greater or lesser than 1°.

The behavior of hyperpolarized spins differs from that of spins at thermal equilibrium. After a transient phase, thermal equilibrium spins will reach a steady-state, where the signal (the transverse magnetization) levels out at typically 20%-50% of $M_0$. However, when the spins are hyperpolarized and the relaxation times are long compared with the duration of the scan, no steady-state is reached. Rather, the magnetization will gradually be tilted by the RF pulses from a starting position along the z-axis down to the xy-plane.

Figure 7:
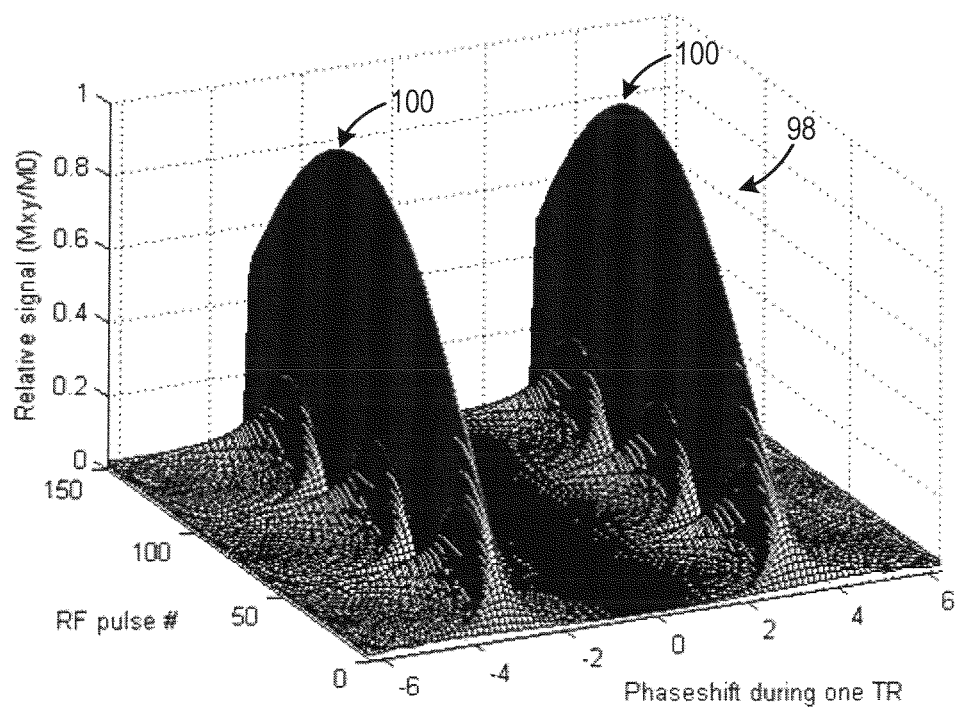
FIG. 7 is a graph of trueFISP signals from hyperpolarized spins as function of phase shift per TR and RF pulse number.

FIG. 7 shows trueFISP signals 98 from hyperpolarized spins as function of phase shift per TR and RF pulse number. The trueFISP signals 98 were acquired using a flip angle of 1°, and the magnetization is aligned with the z-axis before the first pulse. Further, the trueFISP signals 98 were acquired with TR=2.5 ms, $T_1$=30 s, and $T_2$=2 s. It can be seen that maximum signals 100, i.e., after the 90th RF pulse, equals $M_0$. Thus, the full hyperpolarized signal can be utilized, despite the low flip angle.

Figure 8:
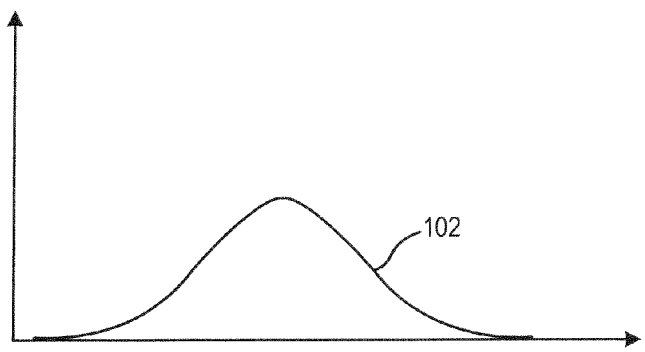
FIG. 8 is another modulation envelope of the RF pulse amplitude in accordance with an embodiment of the present invention.

FIG. 8 shows a pulse sequence modulation envelope 102 according to another embodiment of the present invention. Pulse sequence modulation envelope 102 is a Gaussian-shaped modulation envelope to which flip angles of the trueFISP sequence 70 (shown in FIG. 2) may be set such that the total flip angle ranges from 90° to 180°. In a preferred embodiment, maximum pulse 105 has a flip angle between 5° and 15°.

Figure 9:
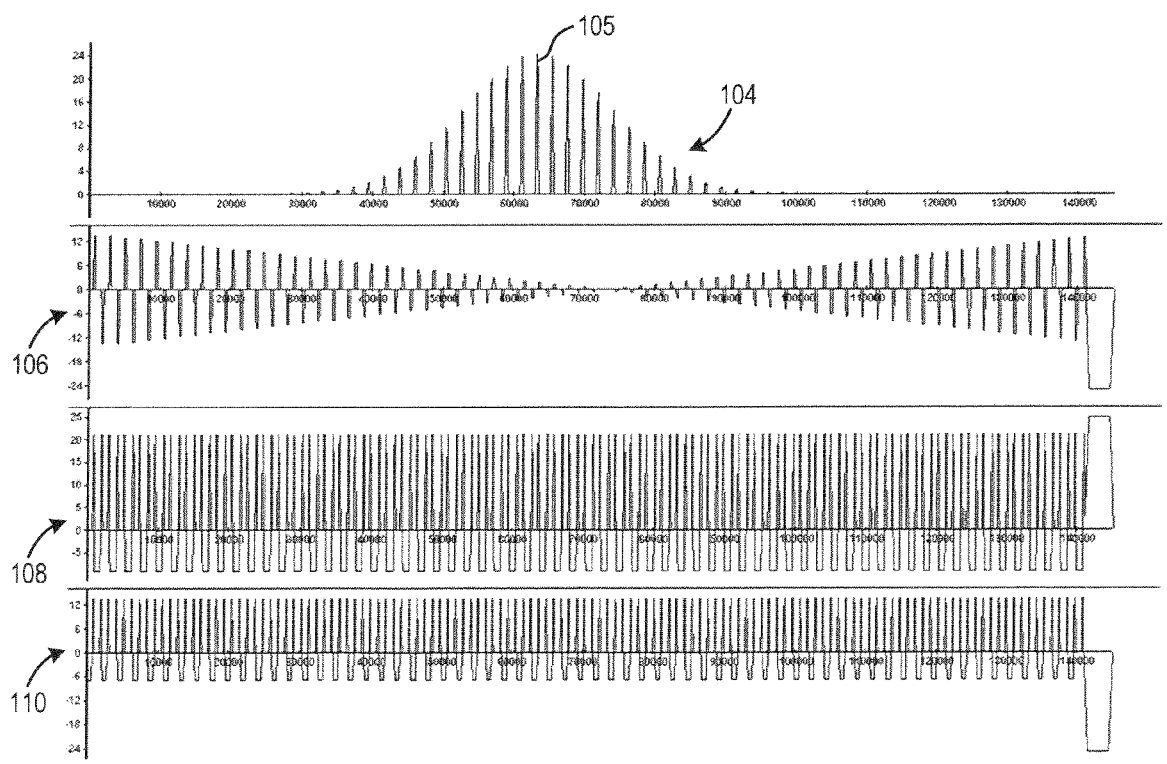
FIG. 9 is a pulse sequence diagram incorporating the pulse sequence modulation envelope of FIG. 8 in accordance with an embodiment of the present invention.

FIG. 9 shows a pulse sequence according to the pulse sequence modulation envelope 102 of FIG. 8. RF pulses 104 are modulated according to the Gaussian-shaped modulation envelope 102, and phase gradient pulses 106, read gradient pulses 108, and slice encoding gradient pulses 110 are also determined.

Figure 10:
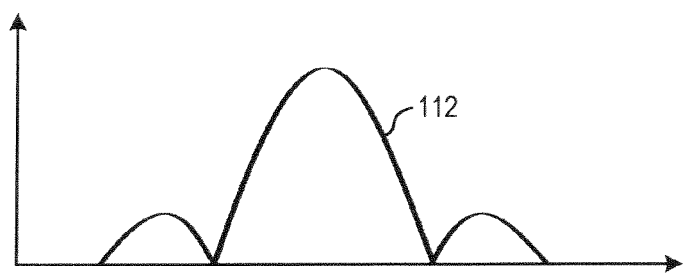
FIG. 10 is another modulation envelope of the RF pulse amplitude in accordance with an embodiment of the present invention.
Figure 11:
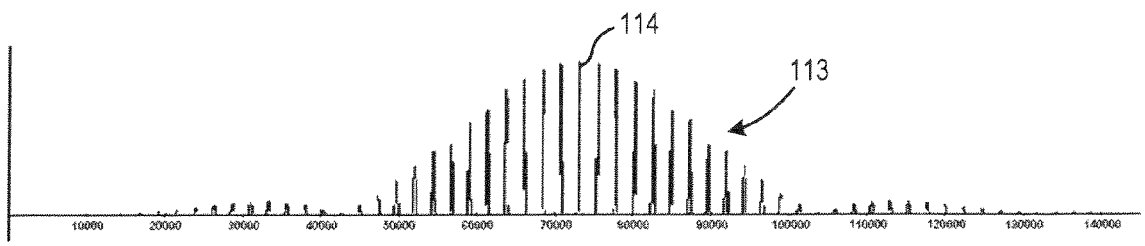
FIG. 11 is a pulse sequence diagram incorporating the pulse sequence modulation envelope of FIG. 10 in accordance with an embodiment of the present invention.

In addition to the Gaussian-shaped modulation envelope 102 shown in FIG. 8, it is contemplated that other modulation envelope shapes are possible. For example, FIG. 10 shows an RF pulse modulation envelope 112 having a shape of a sinc function. FIG. 11 shows a pulse sequence according to the pulse sequence modulation envelope 112 of FIG. 10. RF pulses 113 are modulated according to the shape of the sinc function modulation envelope 112 such that the total flip angle ranges from 90° to 180°. In a preferred embodiment, maximum pulse 114 has a flip angle between 5° and 15°.

Figure 12:
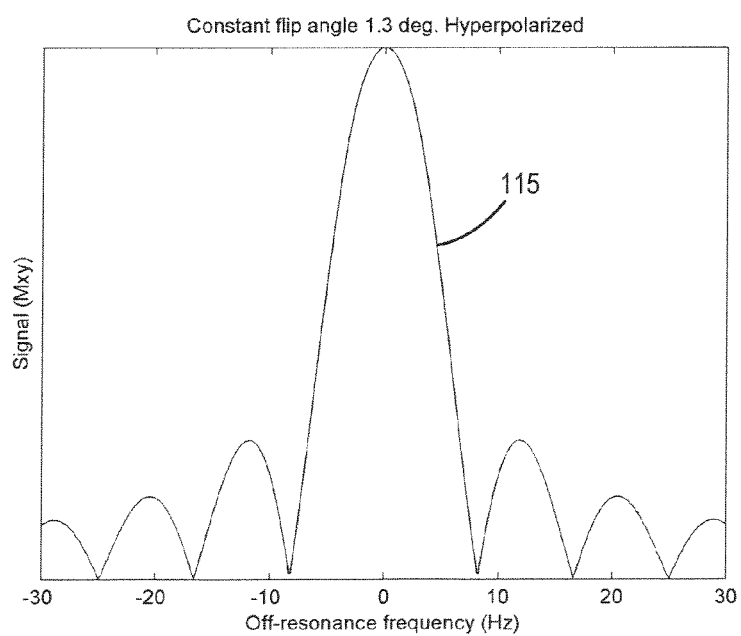
FIG. 12 is a graph of frequency selectivity of a trueFISP sequence incorporating a constant amplitude of the RF pulses in accordance with an embodiment of the present invention.
Figure 13:
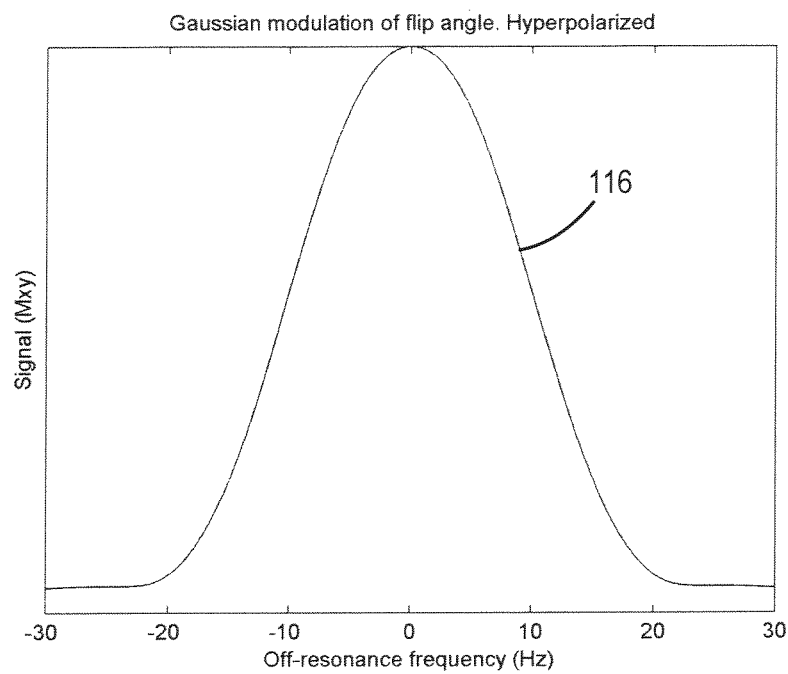
FIG. 13 is a graph of frequency selectivity of a trueFISP sequence incorporating a Gaussian modulation envelope of the RF pulse amplitude in accordance with an embodiment of the present invention.
Figure 14:
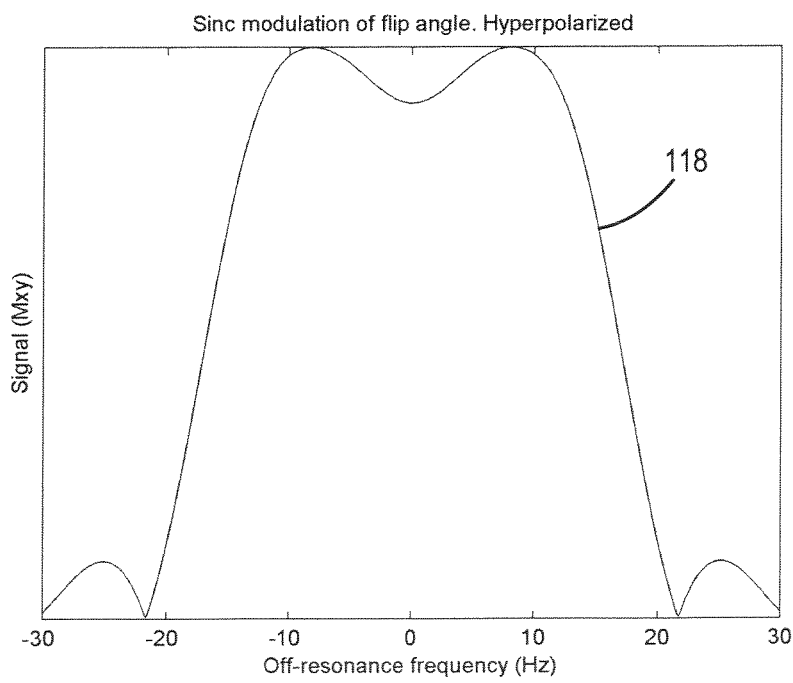
FIG. 14 is a graph of frequency selectivity of a trueFISP sequence incorporating a sinc modulation envelope of the RF pulse amplitude in accordance with an embodiment of the present invention.

FIGS. 12-14 show frequency selectivity of trueFISP sequences having different amplitude modulations of the RF flip angle. The signals 115, 116, 118 shown in FIGS. 12-14, respectively, have been calculated for a repetition time (TR) of 2.5 ms, which is assumed to represent about the shortest possible TR for $^{13}$C imaging on a high-end clinical MR scanner. If the TR can be shortened further, the excitation for FIGS. 12-14 will cover a broader frequency range. Furthermore, calculation were made for a sequence with 96 phase-encoding steps and a total flip angle of 120°. The signal responses shown in FIGS. 12-14 are shown after 48 RF pulses, i.e., at the center of the k-space, with a linear phase-encoding scheme.

FIG. 12 shows that, with constant RF amplitude at a flip angle of 1.3°, the usable frequency range for a reasonably uniform signal intensity is approximately 5 Hz, or approximately ⅓ ppm at 1.5 T. FIG. 13 shows that, with Gaussian amplitude modulation, the usable frequency range for a reasonable uniform signal intensity is approximately double the usable frequency range shown in FIG. 12. FIG. 14 shows that, with a sinc function modulation, the usable frequency range for a reasonably uniform signal intensity is approximately 30 Hz, or approximately 2 ppm, at 1.5 T.

As shown in FIG. 14, imaging of a single hyperpolarized agent metabolite should be possible without additional shimming actions given that other metabolites of interest are sufficiently far away from the excited frequency range. Further optimization of the excitation profiles shown in FIGS. 12-14 can be achieved by adjusting the modulation profile with the respect to the position in the k-space, e.g., adjusting the maximum of the modulation profile such that it does not coincide with the passage of the k-space center.

Figure 15:
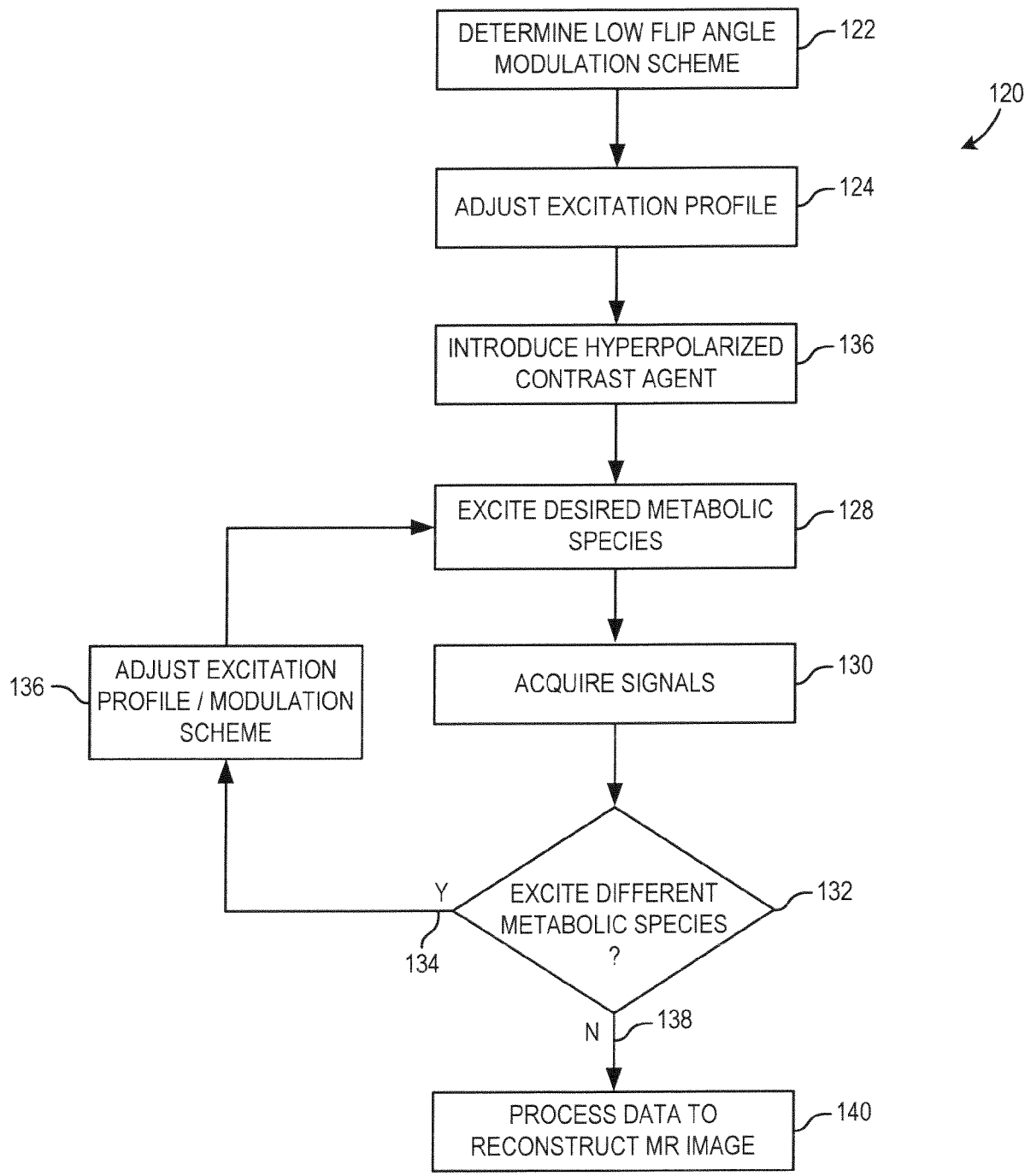
FIG. 15 is a flowchart setting forth the steps of a technique in accordance with an embodiment of the present invention.

Referring now to FIG. 15, a hyperpolarized agent imaging technique 120 in accordance with one embodiment of the present invention is shown. The technique 120 begins with determining, at block 122, a low flip angle modulation scheme for the RF pulse sequence of a modified trueFISP pulse sequence. Determination of the low flip angle modulation scheme includes basing the determination on a desired frequency selectivity as described above as well as on the shimming, or the $B_0$ homogeneity. The low flip angle modulation scheme is based on a constant amplitude envelope, a Gaussian modulation envelope, a sinc modulation envelope, or the like. Additionally, determination of the low flip angle modulation scheme may include a consideration of the hyperpolarized contrast agent. In a preferred embodiment, the hyperpolarized contrast agent includes $^{13}$C nuclei; however, it is contemplated that other hyperpolarized contrast agents may be used, such as $^{14}$N, $^{31}$P, $^{19}$F, and $^{23}$Na nuclei, other NMR relevant nuclei.

Following the determination at block 122 of the low flip angle modulation scheme, an excitation profile of the modified trueFISP pulse sequence is adjusted at block 124 for excitation of a single metabolic species of the hyperpolarized contrast agent. For example, a hyperpolarized $^{13}$C-pyruvate may be injected into an imaging subject, and the excitation profile may be adjusted to excite $^{13}$C-bicarbonate nuclei. The hyperpolarized contrast agent is then introduced into the imaging subject at block 126. Next, the modified trueFISP pulse sequence excites the desired metabolic species at block 128. This excitation may be delayed a specific time period after introduction of the agent to allow for perfusion into tissues, or for the agent to reach an organ of diagnostic interest. Alternatively, a period of delay may correspond to an amount of time for the contrast agent to be metabolized. Signals are then acquired from the excited metabolic species at block 130.

Technique 120 then determines at block 132 whether to excite a different metabolic species for acquiring signals therefrom. If so 134, then the excitation profile is adjusted at block 136 to excite the nuclei for another metabolite. The modulation scheme of the RF pulse sequence may also be adjusted, if desired, such that the modulation scheme for one metabolite is distinct from the modulation scheme for another metabolite. Technique 120 then excites and acquires signals from the other metabolite as described above in blocks 128 and 130. If not 138, MR images are reconstructed for the acquired signal data at block 140. In a preferred embodiment, an image is reconstructed for each metabolite acquired. However, it is contemplated that a combined image may be reconstructed for all metabolites acquired.

Figure 16:
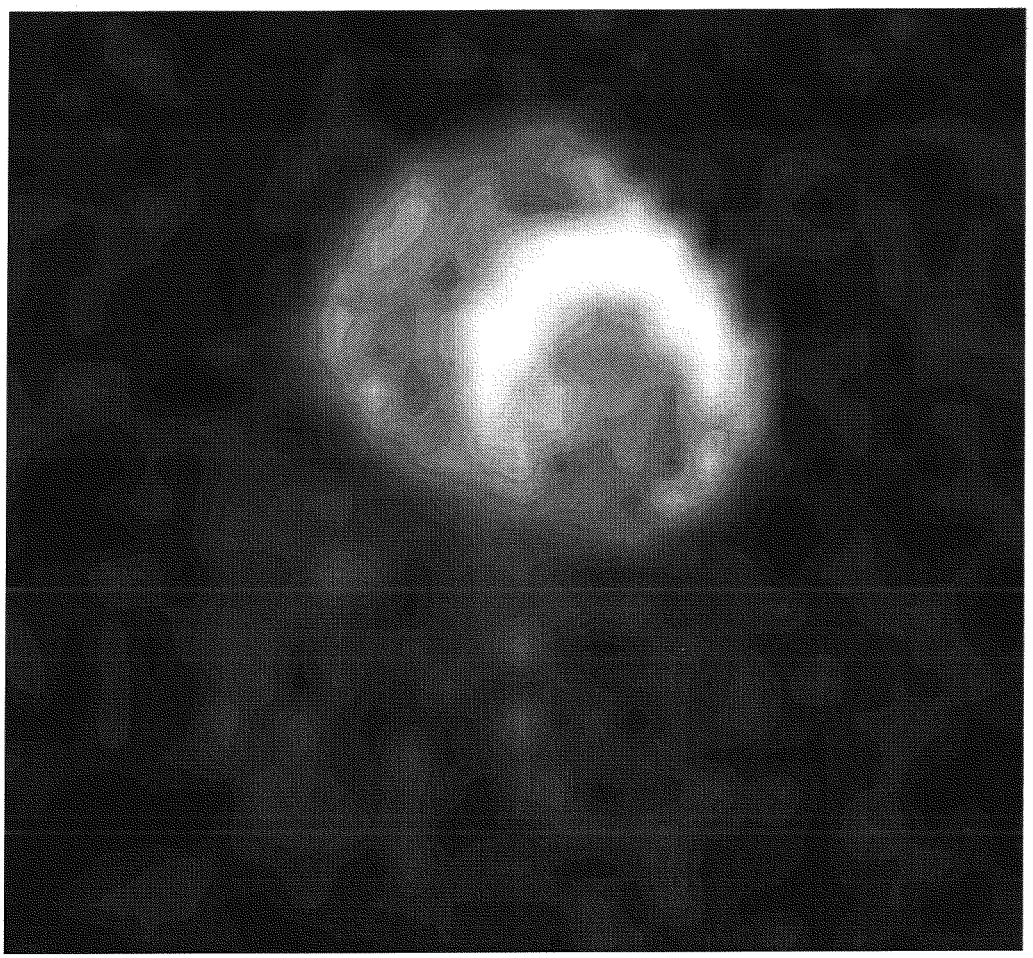
FIG. 16 is an exemplary image acquired in accordance with an embodiment of the present invention.

FIG. 16 shows an exemplary in vivo trueFISP image of a pig heart, acquired with a constant flip angle of 2°. Hyperpolarized $^{13}$C-pyruvate was injected intravenously, and images were acquired with the excitation profile adjusted to the resonance frequency of $^{13}$C-bicarbonate, which is 160 Hz apart from the resonance frequency of pyruvate. FIG. 16 shows the sum of five consecutive images, acquired with 9-Hz frequency separation around the bicarbonate resonance.

Therefore, in accordance with one embodiment of the present invention, an MRI apparatus includes an MRI assembly having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a system controller coupled to the MRI assembly, the system controller configured to cause the RF coil assembly to excite a single metabolic species of a hyperpolarized agent injected into a subject of interest. The system controller further causes the RF transceiver system to acquire MR signals from the excited single metabolic species and reconstruct an image from the acquired MR signals.

In accordance with another embodiment of the invention, a method of hyperpolarized agent MR imaging includes injecting a hyperpolarized agent into a subject of interest and exciting a first metabolic species of the hyperpolarized agent. The method also includes acquiring MR signals from the excited first metabolic species and reconstructing an image from the acquired MR signals.

According to a further embodiment of the invention, a computer readable storage medium includes a computer program stored thereon comprising instructions which when executed by a computer, causes the computer to modulate a plurality of flip angle train RF pulses of a pulse sequence. The instructions further cause the computer to acquire MR data from the plurality of molecules and generate an image from the MR data.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
a magnetic resonance imaging (MRI) assembly having a plurality of gradient coils positioned about a bore of a magnet to impress a polarizing magnetic field and an RF transceiver system and an RF switch controlled by a pulse module to transmit RF signals to an RF coil assembly to acquire MR images; and
a system controller coupled to the MRI assembly, the system controller configured to:
cause the RF coil assembly to excite a single metabolic species of a hyperpolarized agent injected into a subject of interest, wherein in causing the RF coil assembly to excite the single metabolic species, the system controller is configured to apply a true fast imaging with steady precession (trueFISP) pulse sequence having a low flip angle RF pulse train to the single metabolic species;
cause the RF transceiver system to acquire MR signals from the excited single metabolic species; and
reconstruct an image from the acquired MR signals.

2. The MRI apparatus of claim 1 wherein the low flip angle RF pulse train comprises RF pulses having a constant amplitude.

3. The MRI apparatus of claim 2 wherein the RF pulses have a flip angle less than or equal to 2 degrees.

4. The MRI apparatus of claim 1 wherein in causing the RF coil assembly to excite the single metabolic species, the system controller is configured to apply an amplitude varying pulse modulation scheme to the low flip angle RF pulse train.

5. The MRI apparatus of claim 4 wherein the amplitude varying pulse modulation scheme is a Gaussian modulation scheme.

6. The MRI apparatus of claim 4 wherein the amplitude varying pulse modulation scheme is a sinc function modulation scheme.

7. The MRI apparatus of claim 4 wherein the system controller is further configured to adjust the amplitude varying pulse modulation scheme such that a maximum thereof coincides with a passage through a center of k-space.

8. The MRI apparatus of claim 4 wherein the system controller is further configured to adjust the amplitude varying pulse modulation scheme such that a maximum thereof coincides with a passage through an offset of a center of k-space.

9. The MRI apparatus of claim 1 wherein the system controller is further configured to vary a phase cycling of RF pulses in the low flip angle RF pulse train.

10. The MRI apparatus of claim 1 wherein the system controller is further configured to repeat the excitation and the acquisition for each single metabolic species of the hyperpolarized agent.

11. The MRI apparatus of claim 1 wherein the single metabolic species comprises a single metabolic species of $^{13}$C.

12. A method of hyperpolarized agent MR imaging comprising the steps of:
- injecting a hyperpolarized agent into a subject of interest;
- causing, by way of a system controller of a magnetic resonance imaging (MRI) assembly, an RF coil assembly of the magnetic MRI assembly to excite only a first metabolic species of the hyperpolarized agent via application of a true fast imaging with steady precession (trueFISP) pulse sequence having a low flip angle RF pulse train to the first metabolic species;
- acquiring MR signals from the excited first metabolic species via an RF transceiver system of the MRI assembly; and
- reconstructing an image from the acquired MR signals.

13. The method of claim 12 wherein the step of exciting comprises:
- modifying a flip angle train according to a first low angle modulation pattern; and
- applying a pulse sequence having the modified flip angle train to the first metabolic species.

14. The method of claim 13 wherein the step of modifying comprises modifying the flip angle train according to a constant amplitude low angle modulation pattern having amplitudes less than 2 degrees.

15. The method of claim 13 wherein the step of modifying comprises modifying the flip angle train according to a Gaussian modulated low angle modulation pattern.

16. The method of claim 13 wherein the step of modifying comprises modifying the flip angle train according to a sinc function modulated low angle modulation pattern.

17. The method of claim 13 further comprising the steps of:
- exciting only a second metabolic species of the hyperpolarized agent; and
- acquiring MR signals from the excited second metabolic species.

18. The method of claim 17 wherein the step of exciting the second metabolic species comprises:
- modifying the flip angle train according to a second low angle modulation pattern distinct from the first low angle modulation pattern; and
- applying a pulse sequence having the modified flip angle train according to the second low angle modulation pattern to the second metabolic species.

19. A non-transitory computer readable medium having stored thereon a computer program comprising instructions which when executed by a computer, causes the computer to:
- modulate a plurality of flip angle train RF pulses of a true fast imaging with steady precession (trueFISP) pulse sequence into a low flip angle RF pulse train;
- cause a system controller to excite, with application of the trueFISP pulse sequence, a plurality of molecules of a single hyperpolarized metabolite within an object;
- acquire MR data from the plurality of molecules; and
- generate an image from the MR data.

20. The computer readable medium of claim 19 wherein the instructions that cause the computer to modulate comprise instructions that cause the computer to set a flip angle for each RF pulse of the plurality of flip angle train RF pulses according to one of a constant low angle sequence, a low angle Gaussian sequence, and a low angle sinc function sequence.

21. The computer readable medium of claim 19 wherein the instructions that cause the computer to modulate comprise instructions that cause the computer to set a flip angle for each RF pulse of the plurality of flip angle train RF pulses according to one of a low angle Gaussian sequence and a low angle sinc function sequence.

* * * * *